(12) United States Patent
Yamano

(10) Patent No.: US 7,763,977 B2
(45) Date of Patent: Jul. 27, 2010

(54) SEMICONDUCTOR DEVICE AND MANUFACTURING METHOD THEREFOR

(75) Inventor: Takaharu Yamano, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 159 days.

(21) Appl. No.: 11/984,596

(22) Filed: Nov. 20, 2007

(65) Prior Publication Data

US 2008/0128917 A1    Jun. 5, 2008

(30) Foreign Application Priority Data

Nov. 24, 2006    (JP) ............... P.2006-317477

(51) Int. Cl.
*H01L 23/48* (2006.01)
*H01L 23/52* (2006.01)
*H01L 29/40* (2006.01)

(52) U.S. Cl. ............ 257/738; 257/777; 257/778; 257/692; 257/E21.502

(58) Field of Classification Search ........... 257/738, 257/777, 778, 692, E21.502
See application file for complete search history.

(56) References Cited

U.S. PATENT DOCUMENTS

| 2002/0022301 A1 | 2/2002 | Kwon et al. |
| 2002/0175409 A1 | 11/2002 | Tsubosaki |
| 2006/0170096 A1* | 8/2006 | Yang et al. ........... 257/723 |

FOREIGN PATENT DOCUMENTS

| EP | 1 255 295 A1 | 11/2002 |
| EP | 1 335 442 A2 | 8/2003 |
| JP | 4-116831 | 4/1992 |
| JP | 9-64049 | 3/1997 |
| JP | 2004-111382 | 4/2004 |

* cited by examiner

*Primary Examiner*—Cuong Q Nguyen
*Assistant Examiner*—Cathy N Lam
(74) *Attorney, Agent, or Firm*—Drinker Biddle & Reath LLP

(57) ABSTRACT

It is a semiconductor device that has a semiconductor chip on which an electrode pad is formed, an electric connection member formed on the electrode pad, an insulating layer formed on the semiconductor chip, and an electrically conductive pattern connected to the electric connection member. An opening portion corresponding to the electric connection member is formed in the conductive pattern. The conductive pattern is electrically connected to the electric connection member by an electrically conducting paste embedded in the opening portion.

3 Claims, 15 Drawing Sheets

SEMICONDUCTOR DEVICE AND MANUFACTURING METHOD THEREFOR

BACKGROUND OF THE INVENTION

The present invention relates to a semiconductor device, to which chip-size packaging is applied, and a manufacturing method therefor.

Various type semiconductor chip packaging structures have been proposed. With miniaturization of packaged chips, for example, what is called a chip-size packaging structure has been proposed, in which a rewiring layer (i.e., a wiring layer for packaging) is formed, on a passivation layer (i.e., a protection layer) of a device-forming surface of a semiconductor chip.

According to the chip-size packaging, a method has been proposed, in which, for example, an electric connection member such as a bump is formed on each of electric connection members by a bonding-wire, and in which a packaging device (i.e., a semiconductor device) is then formed by forming a rewiring layer connected to each of the electric connection members (see, for example, Patent Document 1).

[Patent Document 1] JP-A-9-64049

However, the method proposed in Patent Document 1 (i.e., JP-A-9-64049) has a problem that when a rewiring layer is formed on the electric connection member formed by bonding, it is necessary to adjust a height (i.e., perform leveling) of the electric connection member.

For example, the electric connection member (e.g., a bump) formed by a bonding-wire is formed using, e.g., a wire bonder. The connection of the bonding-wire to an electrode pad, and the cutting of the connected bonding-wire are consecutively performed to thereby form the electric connection member.

Accordingly, the bump formed by the bonding-wire varies in height from a bump-forming surface (i.e., the electrode pad). This makes it difficult to form a rewiring layer to be connected to the bump, without changing the bump. Consequently, a process of applying a predetermined load to the bump so as to planarize the bump is needed.

Such planarization of the bump is usually performed on a wafer (i.e., before the wafer is diced into individual chips). However, a problem occurs, in which when the planarization of many bumps formed on a wafer surface of, for example, a recent mainstream wafer having a diameter of 300 mm, the variation in the height of the bump increases.

Another problem occurs, in which, for example, when the variation in the height of the bump increases, variation in the connection state between the bump and a rewiring layer connected to the bump occurs, so that the reliability of a semiconductor device (i.e., a packaging device) is degraded.

Additionally, according to the method disclosed in patent Document 1 (i.e., JP-A-9-64049), an insulating layer is formed to cover the bump. Accordingly, a polishing process of polishing the insulating layer is required to expose the bump. To form a rewiring layer upon completion of polishing-process, a process of desmearing a surface of the insulating layer (i.e., what is called a desmear process) is needed. Consequently, a process for forming a plating layer is complicated. This causes increase in cost of manufacturing a semiconductor device (i.e., a packaging device).

Although an electrically conductive layer can be formed by a sputtering method or a CVD method, these methods require costly film-forming apparatuses. This leads to increase in cost of manufacturing. Consequently, these methods are impractical.

SUMMARY OF THE INVENTION

Accordingly, it is a general object of the invention is to provide a newly useful semiconductor device having solved the aforementioned problems, and to provide a manufacturing method therefor.

A more specific object of the invention is to provide a highly reliable semiconductor device that can be manufactured at low cost, and to provide a manufacturing method therefor.

To achieve the foregoing objects, according to a first aspect of the invention, there is provided with a method of manufacturing a semiconductor device, including:

a first step of forming an electric connection member on an electrode pad formed in a region corresponding to a semiconductor chip on a substrate;

a second step of forming an insulating layer and a first conductive layer on the substrate;

a third step of forming an electrically conductive pattern by performing pattern etching of the first conductive layer and of exposing the electric connection member;

a fourth step of electrically connecting the conductive pattern to the electric connection member by an electrically conducting paste; and a fifth step of cutting the substrate into individual pieces.

According to a second aspect of the invention, there is provided with the method of manufacturing a semiconductor device according to the first aspect, wherein in the first step, the electric connection member is formed by a bonding wire.

According to a third aspect of the invention, there is provided with the method of manufacturing a semiconductor device according to the first or second aspect, wherein in the second step, a second conductive layer is formed on the first conductive layer, and in the third step, the first conductive layer and the second conductive layer are formed into different shapes by performing pattern etching.

According to a fourth aspect of the invention, there is provided with the method of manufacturing a semiconductor device according to the third aspect, wherein in the third step, an electrode pad for forming an external connection terminal is formed by performing pattern etching of the second conductive layer.

According to a fifth aspect of the invention, there is provided with the method of manufacturing a semiconductor device according to the fourth aspect, wherein in the second step, a third conductive layer is formed on the second conductive layer, and in the third step, an electrically conductive post for forming an external connection terminal is formed by performing pattern etching of the third conductive layer.

According to a sixth aspect of the invention, there is provided with the method of manufacturing a semiconductor device according to any one of the first to fifth aspects, wherein the fourth step includes:

a substep of forming a layer including a photosensitive conducting paste, and a substep of performing patterning of the layer including the photosensitive conducting paste by a photolithography method.

According to a seventh aspect of the invention, there is provided with the method of manufacturing a semiconductor device according to any one of the first to fifth aspects, wherein the fourth step includes:

a substep of forming a mask pattern which is patterned by a photolithography method, and a substep of forming the conducting paste using the mask pattern as a mask.

To achieve the foregoing objects, according to an eighth aspect of the invention, there is provided with a semiconductor device including:

a semiconductor chip on which an electrode pad is formed;

an electric connection member formed on the electrode pad;

an insulating layer formed on the semiconductor chip; and an electrically conductive pattern connected to the electric connection member, wherein an opening portion corresponding to the electric connection member is formed in the conductive pattern; and the conductive pattern is electrically connected to the electric connection member by an electrically conducting paste embedded in the opening portion.

According to a ninth aspect of the invention, there is provided with the semiconductor device according to the eighth aspect, wherein the electric connection member is formed by a bonding wire.

According to a tenth aspect of the invention, there is provided with the semiconductor device according to the eighth or ninth aspect, wherein an electrode pad or an electrically conductive post is formed on the conductive pattern so as to form an external connection terminal thereon.

According to the invention, a highly reliable semiconductor device, which can be manufactured at low cost, and a manufacturing method therefor can be provided.

DETAILED DESCRIPTION OF THE PREFERRED EMBODIMENTS

Figure 1:
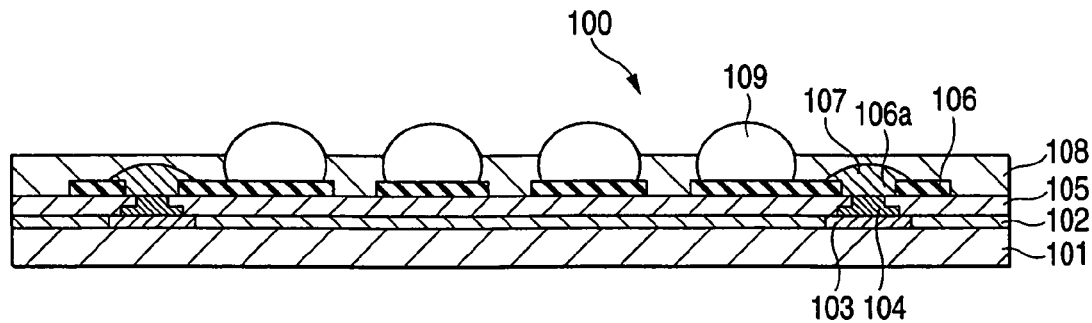
FIG. 1 is a view illustrating a semiconductor device according to Embodiment 1.

A method of manufacturing a semiconductor device according to the invention is featured by having the following steps. That is, 1) a first step of forming an electric connection member on an electrode pad formed in a region corresponding to a semiconductor chip on a substrate, 2) a second step of forming an insulating layer and a first conductive layer on the substrate, 3) a third step of forming an electrically conductive pattern by performing pattern etching of the first conductive layer and of exposing the electric connection member, 4) a fourth step of electrically connecting the conductive pattern to the electric connection member by an electrically conducting paste, and 5) a fifth step of cutting the substrate into individual pieces.

The method of manufacturing a semiconductor device features that the electrically conductive pattern formed on the substrate (i.e., on the insulating layer) and the electric connection portion including, for example, a bump are electrically connected to each other by the electrically conducting paste. Also, to do this, when the conductive pattern (i.e., a pattern wiring) is formed by performing the patterning (i.e., the pattern-etching) of the conductive layer formed on the substrate (i.e., on the insulating layer), patterning is performed (e.g., an opening portion to the electrically conductive pattern is formed) so as to expose the electric connection member to the conductive pattern. The conductive pattern and the electric connection portion are electrically connected by the conducting paste by, for example, embedding the opening portion with the paste.

Thus, a semiconductor device formed by the aforementioned method of manufacturing a semiconductor device is such that the area of a part electrically connecting the electric connection member and the conductive pattern is increased. Additionally, the connection between the electric connection member and the conductive pattern is a metal junction due to metallic particles included in the electrically conducting paste. Favorable reliability of the electrical connection between the electric connection member and the conductive pattern is obtained.

According to the aforementioned manufacturing method, the reliability of the electrical connection between the electric connection member and the conductive pattern is difficult to be affected by variation in height of the electric connection member. Thus, a rewiring layer having favorable connection reliability can be formed by a simple method using the electric connection member, such as the bump, which is formed by bonding (e.g., using a bonding wire) and relatively largely varies in height. According to the aforementioned method, a grinding process for exposing a projection portion of the electric connection member from the insulating layer is unnecessary.

Also, the aforementioned manufacturing method features that a plating process using a plating solution, and a sputtering process requiring a decompression treatment are unnecessary. For example, the plating process and the sputtering process require complex treatments and costly processing units and are sometimes a factor in increasing the manufacturing cost of a semiconductor device.

In contrast, the manufacturing method according to the invention can easily manufacture a semiconductor device by a simple method, without requiring a plating process and a sputtering process. The method according to the invention has an advantage in suppressing the manufacturing cost of a semiconductor device, as compared with the conventional method.

Next, the structure of the semiconductor device according to the invention, and more specific examples of the manufacturing method according to the invention are described below with reference to the accompanying drawings.

Embodiment 1

FIG. 1 is a cross-sectional view schematically illustrating a semiconductor device according to Embodiment 1. Referring to FIG. 1, an outline of a semiconductor device 100 according to the present embodiment is such that a rewiring layer (i.e., a wiring layer for packaging) is formed on a semiconductor chip 101. This structure is sometimes called a chip-size packaging (CSP) structure.

Each of electrode pads 103 connected to a device (not shown) is on a device-forming surface of the semiconductor chip 101. The remaining part of the device-forming surface other than the electrode pads 103 is covered with a protection layer (i.e., a passivation layer) 102. An electric connection member 104 including, for example, a bump is formed on each of the electrode pads 103. Also, an insulating layer 105 is formed on the semiconductor chip 101 (i.e., on the protection layer 102). An electrically conductive pattern (i.e., a pattern wiring) 106 connected to the electric connection member 104 is formed on the insulating layer 105.

Additionally, an insulating layer (i.e., a solder-resist layer) 108 is formed on the conductive pattern 106 so as to partly expose the conductive pattern 106. An external connection terminal 109 including, for example, a solder bump, is provided on the conductive pattern 106 exposed from the insulating layer 108.

The semiconductor device 100 according to the present embodiment features that an opening portion 106a corresponding to each of the electric connection members 104 is formed in the conductive pattern 106, and that the conductive pattern 106 and the electric connection member 104 are electrically connected to each other by the electrically conducting paste 107 embedded in the opening portion 106a and by the metal junction.

Consequently, the present embodiment has an advantage in obtaining favorable reliability of the electrical connection between the electric connection member 104 (i.e., the electrode 103) and the conductive pattern 106. In the case of obtaining the electrical connection by engaging the electric connection member (e.g., the bump) with the conductive pattern similarly to the invention disclosed in JP-A-9-64049, it is difficult to assure the contact area between the electric connection member and the conductive pattern, which is sufficient for achieving favorable reliability of the electric connection therebetween. That is, it is substantially difficult to assure the reliability of the electric connection therebetween.

On the other hand, in the semiconductor device according to the present embodiment, each of the conducting pastes 107 is provided so as to embed the associated opening portion 106a formed in the conductive pattern 106. Thus, the contact area between the electric connection member 104 and the conductive pattern 106 for achieving the electric connection therebetween is increased. Also, this connection therebetween has a metallization structure formed by the metal junction due to the metallic particles included in the electrically conducting paste. Consequently, favorable reliability of the electric connection is obtained.

Furthermore, according to the above structure, the reliability of the electrical connection between the electric connection member 104 and the conductive pattern 106 is difficult to be affected by variation in height of the electric connection member 104. Thus, favorable reliability of the semiconductor device can be obtained.

For example, in the case of manufacture a semiconductor device, using the recent mainstream wafer having a diameter of 300 mm, it has become difficult to perform processing in a surface of a wafer (or substrate), for example, suppression of warpage of each of the wafer (or substrate) and a jig used for manufacture of the semiconductor device. Accordingly, in the semiconductor device, due to the structural feature thereof, the reliability of the electric connection between the electric connection member 104 and the conductive pattern 106 is difficult to be affected by the manufacturing variation.

Additionally, the above structure has a feature that a semiconductor device can be manufactured by a simple method without undergoing complex treatments, such as a plating method and a sputtering method. The aforementioned manufacturing method will be described by referring to FIG. 4A or later.

In the above structure, for example, the protection layer 102 is made of $Si_3N_4$, SiN, or SiON. The electrode pad 103 is made of Al. The electric connection member 104 is formed of an Au-bump. The insulating layer 105 is made of a resin material (e.g., NCF (Non-Conductive Film). The conductive pattern 106 is made of Cu. The conducting paste 107 is made of Ag- or Cu-paste. The insulating layer 108 is formed of a solder-resist layer. The external connection terminal 109 is made of solder. However, the aforementioned materials are illustrative examples. The materials of these components are not limited thereto.

The above semiconductor device 100 can be modified or altered, for example, as will be described in the following description.

Embodiment 2

Figure 2:
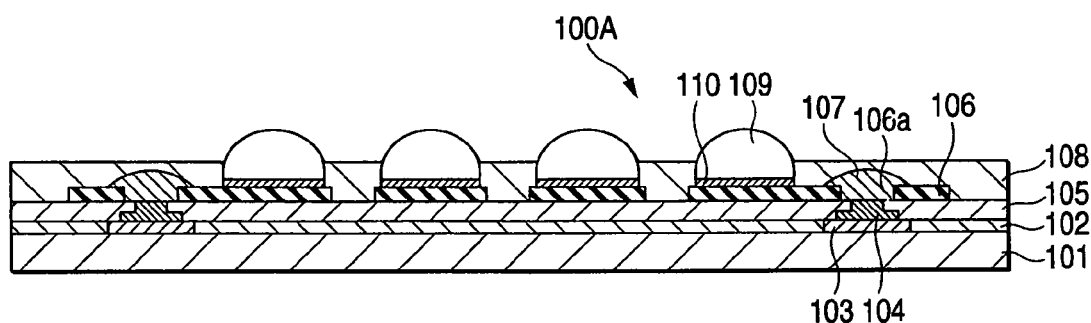
FIG. 2 is a view illustrating a semiconductor device according to Embodiment 2.

FIG. 2 is a cross-sectional view schematically illustrating a semiconductor device according to Embodiment 2. In the drawings to be described later, components, each of which is the same as or correspond to the above-described component, are designated by the same reference numerals. The description of each of such components may be omitted (this is the same with the following descriptions of the other embodiments).

Referring to FIG. 2, a semiconductor device 100A according to Embodiment 2 differs from Embodiment 1 (i.e., the semiconductor device 100) in that an electrode pad 110 corresponding to an external connection terminal 109 is formed on an electrically conductive pattern 106.

The electrode pad 110 is made of, for example, Sn, Ni, and Ti. The material of the electrode pad 110 is not limited thereto. The electrode pad 110 is formed into a shape differing from that of the conductive pattern 106. The electrode pad 110 is formed by being patterned into a shape corresponding to, for example, the shape of the opening portion of the insulating layer 108 or the shape of the external connection terminal 109. Thus, another conductive pattern (e.g., the electrode pad 110) can be formed on the conductive pattern 106.

Embodiment 3

Figure 3:
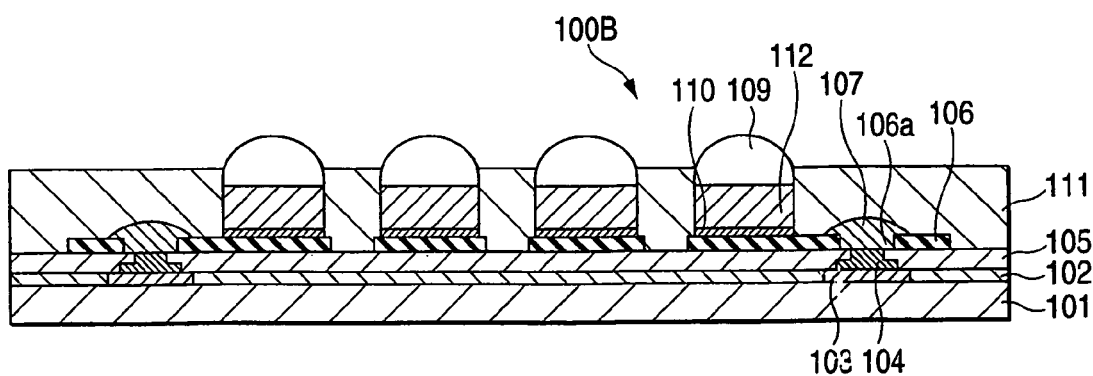
FIG. 3 is a view illustrating a semiconductor device according to Embodiment 3.

FIG. 3 is a cross-sectional view schematically illustrating a semiconductor device according to Embodiment 3. Referring to FIG. 3, a semiconductor device 100B according to Embodiment 3 differs from Embodiment 2 (i.e., the electrode pad 110) in the following two respects. Embodiment 3 is similar to Embodiment 2 in the other structural components.

First, in the semiconductor device 100B according to Embodiment 3, an electrically conductive post 112 made of, for example, Cu, which corresponds to the external connection terminal 109, is formed on the electrode pad 110. Further, for example, an insulating layer 111 made of a sealing resin (e.g., a mold resin) is formed, instead of the insulating layer 108 formed of a solder-resist layer. The insulating layer 111 is formed so as to cover a side wall of the conductive post 112.

With the aforementioned structure, Embodiment 3 has an advantage that in a case where the semiconductor device 100B is connected to a substrate, such as a motherboard, which is a connection target, stress applied to the conductive pattern 106 (i.e., the semiconductor chip 101) and to the external connection terminal 109 is released.

Next, the method of manufacturing the aforementioned semiconductor device is described below in cases where the semiconductor device to be manufactured is the semiconductor device 100 according to Embodiment 1, where the semiconductor device to be manufactured is the semiconductor device 100A according to Embodiment 2, and where the semiconductor device to be manufactured is the semiconductor device 100B according to Embodiment 3, in this order.

Embodiment 4

FIGS. 4A to 4M are views illustrating an example of the method of manufacturing the semiconductor device shown in FIG. 1 in the order of steps to be sequentially performed.

Figure 4A:
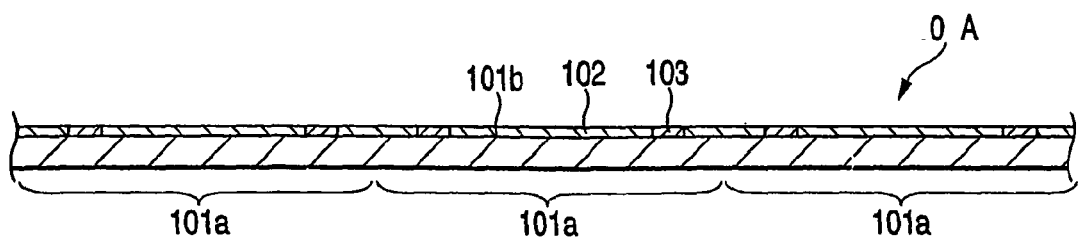
FIG. 4A is a view (#1) illustrating a method of manufacturing the semiconductor device shown in FIG. 1.

First, in a step illustrated in FIG. 4A, a substrate (i.e., Si-wafer) 101A having a plurality of regions 101a (which are, for example, arranged like a lattice), in each of which a device is formed is prepared. The thickness of the substrate 101A is assumed to range from about 500 μm to about 775 μm. The region 101a corresponds to a single semiconductor chip. A rewiring layer (i.e., an electrically conductive layer) is formed on the region 101a in steps which will be described in the following description. Thereafter, the substrate 101A is cut by dicing. Consequently, the semiconductor device (i.e., the semiconductor chip) is cut into individual pieces.

Electrode pads 103 are formed on a device-forming surface 101b, on which a device is formed, on each of the regions 101a. Additionally, the rest of the device-forming surface 101b other than the electrode pads 103 is protected by a protection layer (i.e., a passivation layer) 102 made of SiN (i.e., $Si_3N_4$).

Figure 4B:
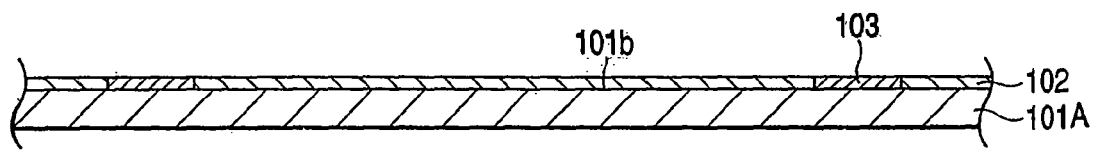
FIG. 4B is a view (#2) illustrating the method of manufacturing the semiconductor device shown in FIG. 1.

FIG. 4B is an enlarged view of one of the regions 101a of the substrate 101A shown in FIG. 4A. In FIG. 4B or later, the method of manufacturing the semiconductor device is described by illustrating one of the regions 101a of the substrate 101A, in which a plurality of regions 101a are formed, by way of example.

Figure 4C:
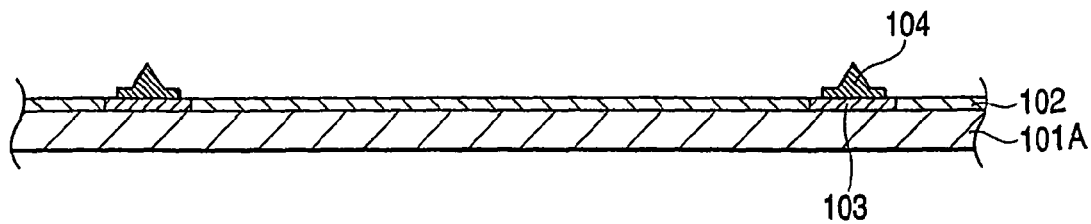
FIG. 4C is a view (#3) illustrating the method of manufacturing the semiconductor device shown in FIG. 1.

Next, in a step illustrated in FIG. 4C, an electric connection member 104 formed by a bonding wire made of Au or Cu, using, for example, a wire bonder is formed on the electrode pad 103. The wire bonder performs the connection of the bonding-wire to an electrode pad, and the cutting of the connected bonding-wire consecutively to thereby form the electric connection member 104.

Additionally, a metallic film including Cu-plating film, Au-plating film, Ni-film formed by electroless-plating, and Au-film covering the Ni-film can be used as the electric connection member 104.

Figure 4D:
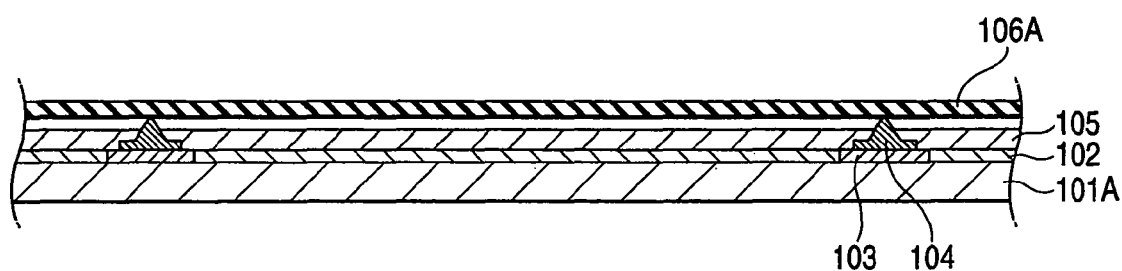
FIG. 4D is a view (#4) illustrating the method of manufacturing the semiconductor device shown in FIG. 1.

Next, in a step illustrated in FIG. 4D, an insulating layer 105 made of, for example, an epoxy resin material is formed on the substrate 101A (i.e., on the protection layer 102). The thickness of the insulating layer 105 is set to be within about 20 μm to about 100 μm. The insulating layer 105 is formed by, for example, laminating (or pasting) a film-like resin or by applying liquid resin. Preferably, a projection portion of the electric connection member 104 is exposed from the insulating layer 105.

The material of the insulating layer 105 is not limited to the aforementioned material (NCF). The material of the insulating layer 105 can be formed by using various insulating materials (e.g., resin materials). For example, resin materials such as NCP (Non-Conductive paste), ACF (Anisotropic Conductive Film (or Anisotropically-Conductive Film)), and ACP (Anisotropic Conductive paste (or Anisotropically-Conductive paste)), or usually used what is called a build-up resin (i.e., an epoxy resin with fillers) can be used as the material of the insulating layer 105.

Next, a conductive layer 106A formed of, for example, a thin copper foil is attached onto the insulating layer 105. In this case, a laminated structure, in which the insulating layer 105 and the conductive layer 106A are preliminarily stacked, can be attached onto the semiconductor chip 101 (i.e., the protection layer 102). The thickness of the conductive layer 106A is set to range from, for example, 2 μm to 18 μm.

Figure 4E:
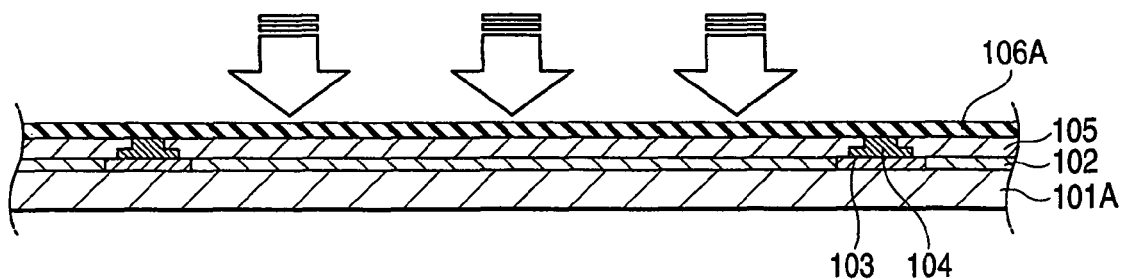
FIG. 4E is a view (#5) illustrating the method of manufacturing the semiconductor device shown in FIG. 1.

Next, in a step illustrated in FIG. 4E, the conductive layer 106A is pressed from the top surface of the conductive layer 106A in a state in which a structure illustrated in FIG. 4E, which includes the insulating layer 105, is heated. Thus, the thermosetting insulating layer 105 is hardened. Thus, the bottom surface of the conductive layer 106A is favorably closely attached to the insulating layer 105. The adhesiveness between the insulating layer 105 and the conductive layer 106A is favorable. Incidentally, after the insulating layer 105 is pressed and hardened, the thickness of the insulating layer 105 ranges, for example, about 10 μm to about 60 μm.

Figure 4F:
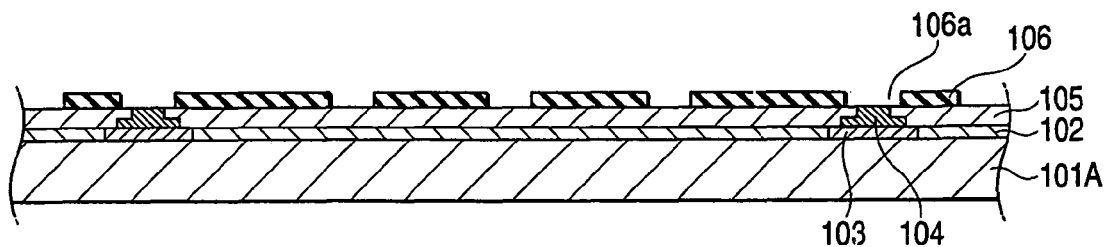
FIG. 4F is a view (#6) illustrating the method of manufacturing the semiconductor device shown in FIG. 1.

Next, in a step illustrated in FIG. 4F, an electrically conductive pattern (i.e., a pattern wiring) 106 is formed by performing the pattern etching of the conductive layer 106A. Also, an opening portion 106a, from which the electric connection member is exposed, is formed in the conductive pattern 106. That is, in this step, the conductive pattern 106 having the opening portion 106a is formed by performing the pattern etching of the conductive layer 106A.

The pattern etching is performed by etching using a predetermined mask pattern (not shown) as a mask. The mask pattern can be formed by performing the patterning of a resist layer, which is formed by applying liquid resist or by pasting film-like resist, according to a known photolithography method. Additionally, upon completion of performing the pattern etching, the mask pattern is exfoliated.

Next, in steps illustrated in FIGS. 4G to 4K, the conductive pattern 106 and the electric connection member 104 are electrically connected by the conducting paste. Further, the conducting paste includes, for example, a photosensitive conducting paste and a nonphotosensitive conducting paste. In the description of the present embodiment, a method using the photosensitive paste is described below.

The photolithography method (i.e., patterning due to exposure or development) can be applied to photosensitive paste, similarly to the photosensitive resist. Thus, microscopic patterns can easily be formed. However, the photosensitive resist is a costly material. Thus, it is preferable to reduce a region, which is removed by development, as much as possible, that is, to reduce a region, in which a layer made of photosensitive resist is formed, as much as possible.

Therefore, as described below, preferably, after a layer made of photosensitive resist is formed in a predetermined region on the conductive pattern 106, which includes the opening portion 106a, and the insulating layer 105 by using, for example, a metal mask (or a stencil mask), patterning according to the photolithography method is applied thereto. That is, in the following example, the technique of print-patterning using a mask with coarse processing accuracy and the technique of patterning with favorable processing accuracy according to the photolithography method are used together.

Figure 4G:
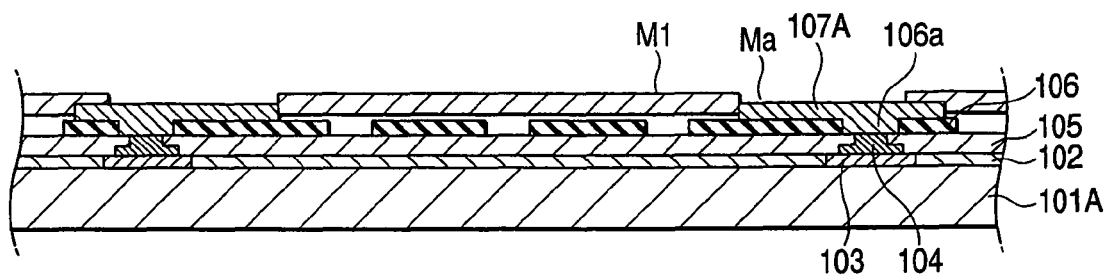
FIG. 4G is a view (#7) illustrating the method of manufacturing the semiconductor device shown in FIG. 1.

For example, in a step illustrated in FIG. 4G, a metal mask M1, in which an opening portion Ma is formed, is provided on the conductive pattern 106 and the insulating layer 105. In this case, a part of the conductive pattern 106 including the opening portion 106a, and a part of the insulating layer 105 are exposed.

Next, the photosensitive conducting paste is applied thereon. Thus, a layer made of a photosensitive conducting paste (i.e., a paste pattern 107A) is formed on the conductive pattern 106 corresponding to the opening portion Ma and on the insulating layer 105. The opening portion 106a is embedded by the paste pattern 107A. Also, the paste pattern 107A reaches the electric connection member 104 exposed from the opening portion 106a. That is, the electric connection member 104 and the conductive pattern 106 are connected to each other through the paste pattern 107A.

Figure 4H:
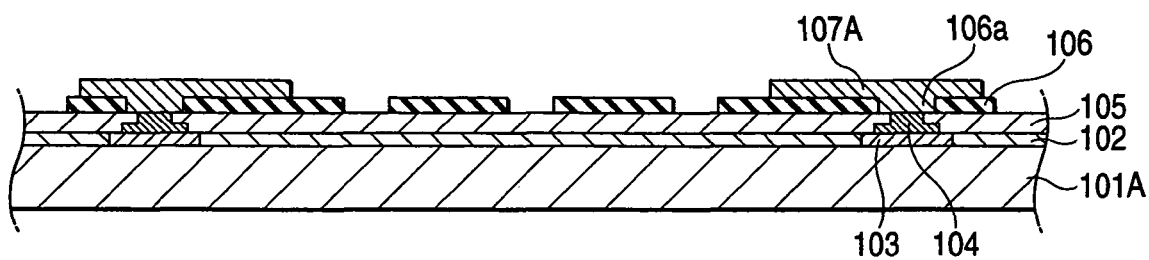
FIG. 4H is a view (#8) illustrating the method of manufacturing the semiconductor device shown in FIG. 1.

Next, the metal mask M1 is removed in a step illustrated in FIG. 4H.

Figure 4I:
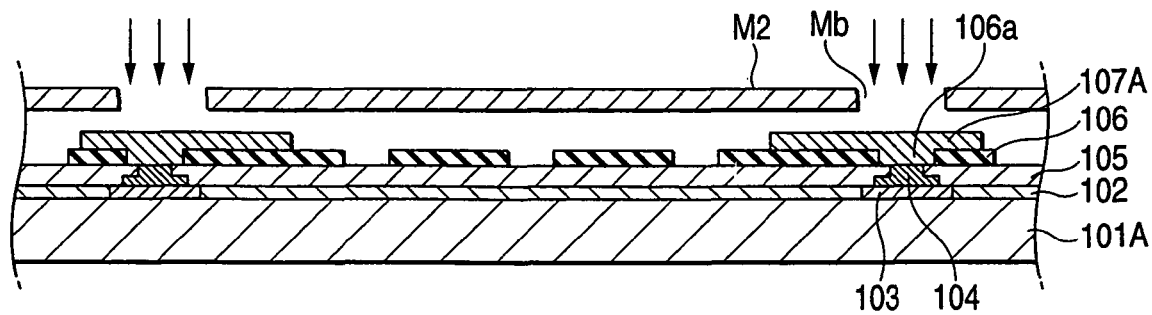
FIG. 4I is a view (#9) illustrating the method of manufacturing the semiconductor device shown in FIG. 1.

Next, in a step illustrated in FIG. 4I, a photomask M2, in which an opening portion Mb is formed, is provided on the paste pattern 107A. In this case, a part of the paste pattern 107A is exposed from the opening portion Mb. The shape of the opening portion Mb corresponds to that of the patterned conducting paste.

Subsequently, for example, UV-light is irradiated on the photomask M2 to thereby expose a part of a layer made of photosensitive resist (i.e., the paste pattern 107A) exposed from the opening portion Mb.

Figure 4J:
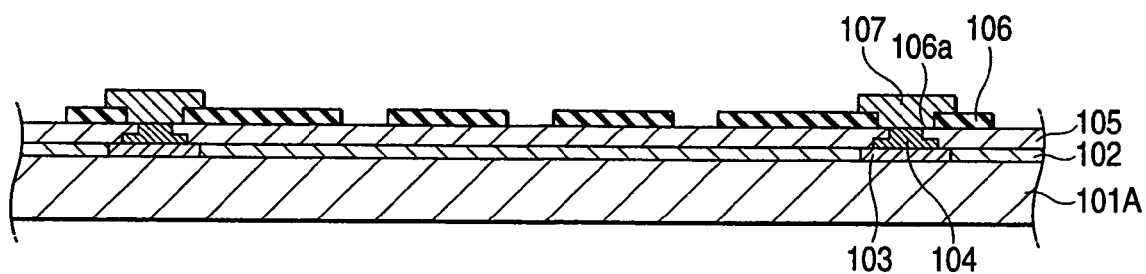
FIG. 4J is a view (#10) illustrating the method of manufacturing the semiconductor device shown in FIG. 1.

Next, in a step illustrated in FIG. 4J, the photomask M2 is removed. The development of the paste pattern 107A is performed. Subsequently, in a step illustrated in FIG. 4K, the thermal hardening of the paste pattern 107A is performed. Thus, an electrically conducting paste 107 is formed.

Figure 4K:
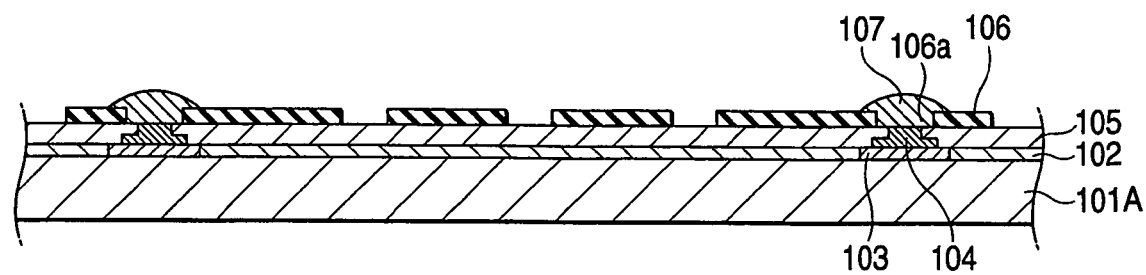
FIG. 4K is a view (#11) illustrating the method of manufacturing the semiconductor device shown in FIG. 1.
Figure 4L:
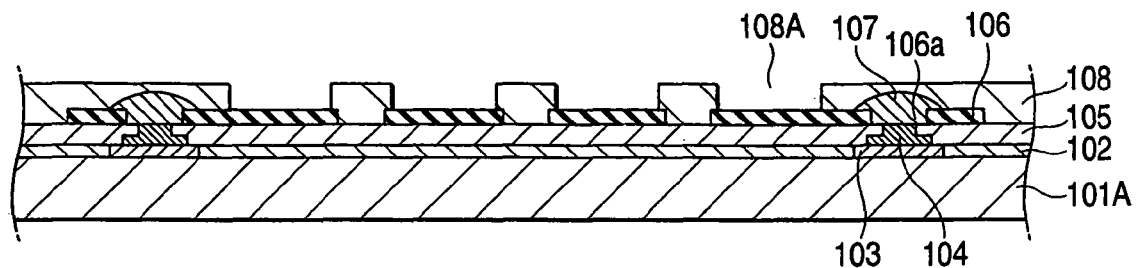
FIG. 4L is a view (#12) illustrating the method of manufacturing the semiconductor device shown in FIG. 1.

Next, in a step illustrated in FIG. 4L, the roughening or the blackening of the conductive pattern (made of Cu) 106 is performed, if needed. An insulating layer 108 formed of a solder-resist layer is formed so as to partly cover the insulating layer 105, the conducting paste 107, and the conductive pattern 106. A part of the conductive pattern 106 is exposed from the opening portion 108A formed in the insulating layer 108.

Figure 4M:
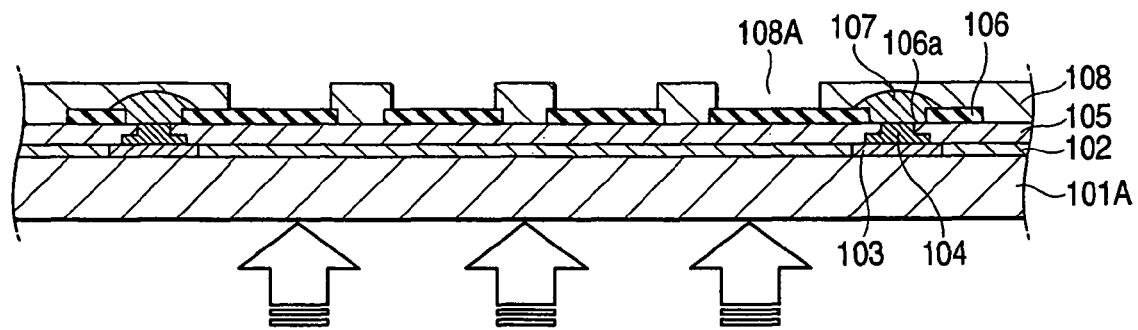
FIG. 4M is a view (#13) illustrating the method of manufacturing the semiconductor device shown in FIG. 1.

Next, in a step illustrated in FIG. 4M, the grinding of the substrate 101A is performed from the rear surface thereof, if necessary. The thickness of the substrate 101A is set to be in a range from, for example, about 100 μm to about 300 μm.

Also, if necessary, the external connection terminal (e.g., a solder bump) 109 previously illustrated in FIG. 1 is formed on the conductive pattern 106 exposed from the opening portion 108A.

Next, the dicing (or cutting) of the substrate 101A is performed. Thus, the substrate 101A is cut into individual pieces corresponding to each region 101a illustrated in FIG. 4A. Consequently, the semiconductor device 100 illustrated in FIG. 1 can be manufactured.

The aforementioned method of manufacturing a semiconductor device features that the conductive pattern 106 formed on the substrate 101A (i.e., the insulating layer 102) and the electric connection portion 104, which includes, for example, a bump, are electrically connected to each other by the conducting paste 107.

Also, when the conductive pattern (i.e., the pattern wiring) 106 is formed therefor by performing the patterning (i.e., the pattern-etching) of the conductive layer formed on the substrate 101A (i.e., the insulating layer 102), the formation (i.e., the patterning) of the opening portion 106a is performed simultaneously with the patterning of the conductive layer so as to expose the electric connection member 104 to the conductive pattern 106. The conducting paste 107 electrically connects the conductive pattern 106 and the electric connection member 104 by embedding the opening portion 106a.

Accordingly, the area of a part, at which the electric connection member 104 and the conductive pattern 106 are electrically connected to each other, is increased. Also, the connection between the electric connection member and the conductive pattern is a metal junction due to the metallic particles included in the conducting paste, so that the reliability of the electric connection between the electric connection member 104 and the conductive pattern 106 becomes favorable.

Further, according to the aforementioned manufacturing method, the reliability of the electric connection between the electric connection member 104 and the conductive pattern 106 is difficult to be affected by the variation in height of the electric connection member 104.

For example, the conventional method of manufacturing a semiconductor device, which is disclosed in JP-A-9-64049, causes the necessity for planarizing the electric connection member (e.g., the bump) formed on the entire surface of a wafer. This is because the conductive pattern (i.e., the conductive layer) is formed according to the conventional method so as to be engaged with the bump.

For example, it is known that variation in the height of the bump formed using a bonding-wire is about 10 μm. Thus, in a case where a rewiring layer to be connected to the bump is formed according to the conventional method, a problem occurs, in which the reliability of the wiring connection is degraded unless what is called a leveling process of uniformizing the height of the bumps is performed. However, it is substantially difficult to perform the planarization on the entire surface of a recent mainstream wafer, which has a diameter of 300 mm, with favorable precision.

In contrast, according to the method of manufacturing a semiconductor device according to the present embodiment, the opening portion 106a is formed in the conductive layer 106 provided immediately above the electric connection member 104. Then, the electric connection between the electric connection member 104 and the conductive pattern 106 is established by embedding the opening portion 106a with the conducting paste. Consequently, the reliability of the electric connection between the electric connection member 104 and the conductive pattern 106 is difficult to be affected by the variation in height of the electric connection member 104.

Accordingly, the manufacturing method according to the present embodiment can easily form a rewiring layer with good reliability by simple processes using the electric connection member 104, such as the bump, which is formed using, for example, a bonding material (e.g., a bonding wire) and which shows a relatively large variation in height thereof.

Additionally, the aforementioned manufacturing method according to the present embodiment features that a plating process using a plating solution, and a sputtering process requiring a decompression treatment are unnecessary, and that thus the manufacturing process is simplified. For example, in the plating process, it is necessary to immerse the substrate in the plating solution. Thus, the conventional method has a problem that the manufacturing process is complicated. Also, for example, in a case where an electroless plating is performed on an insulating film (e.g., a resin film), what is called a desmear process, that is, a process of roughening the insulating film using etchant is required. Consequently, the manufacturing process is complicated. Also, this is a factor in increasing the manufacturing cost of semiconductor devices.

Further, in a case where a sputtering process is required, a decompression state is caused in a manufacturing apparatus. Thus, a costly processing apparatus capable of causing plasma excitation is required. Consequently, a processing time is long. Additionally, this is a factor in increasing the manufacturing cost of semiconductor devices.

In contrast, the manufacturing method according to the present embodiment eliminates the necessity for the plating process and the sputtering process. Thus, a semiconductor device having favorable reliability can be manufactured by performing simple processes. Consequently, the manufacturing method according to the present embodiment has an advantage in suppressing the manufacturing cost, as compared with the conventional method.

Although the photosensitive conducting paste is used in the aforementioned embodiment, a low-cost ordinary conducting paste can be used. Next, an example of using the commonly-used nonphotosensitive conducting paste is described below.

Embodiment 5

FIGS. 5A to 5F are views illustrating an example of the method of manufacturing the semiconductor device according to Embodiment 5 in the order of steps to be sequentially performed. Incidentally, processes, which are not specifically described in the following description of the present embodiment, are similar to the associated ones of Embodiment 4. In the case of the manufacturing method according to the present embodiment, first, steps according to Embodiment 4, which are illustrated in FIGS. 4A to 4F, are performed.

Figure 5A:
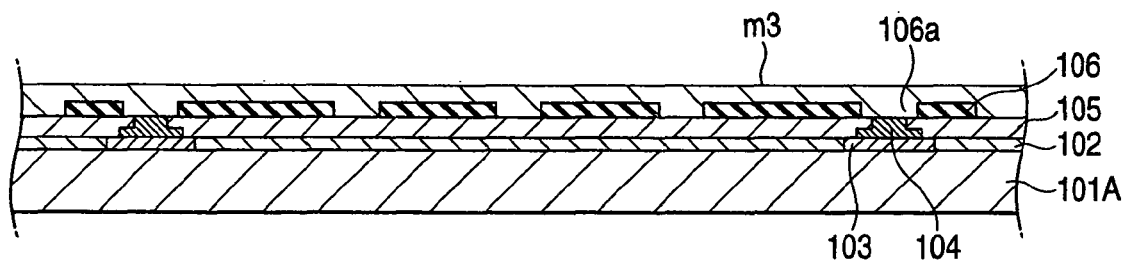
FIG. 5A is a view (#1) illustrating a modification of the method of manufacturing the semiconductor device shown in FIG. 1.

Next, in a step illustrated in FIG. 5A, a photosensitive resist layer m3 is formed so as to cover the insulating layer 105 and the conductive pattern 106. The resist layer can be formed by applying liquid resist or by pasting film-like resist.

Figure 5B:
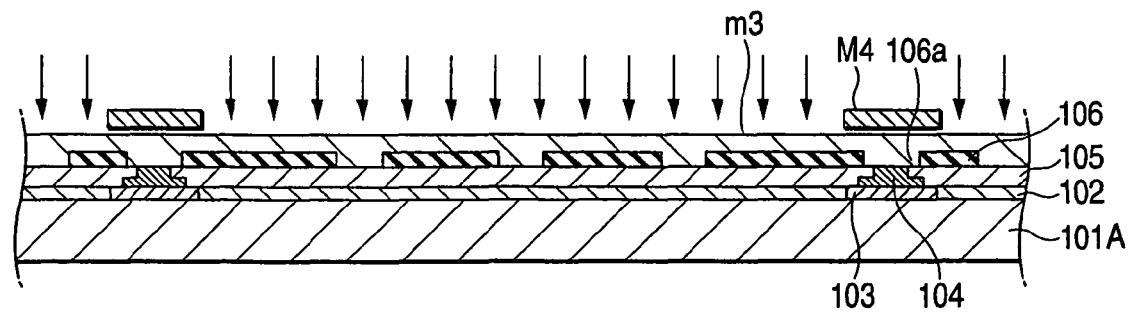
FIG. 5B is a view (#2) illustrating the modification of the method of manufacturing the semiconductor device shown in FIG. 1.

Next, in a step illustrated in FIG. 5B, a photomask M4 is provided on the resist layer m3. Subsequently, UV-light is irradiated on the resist layer m3 to thereby expose the resist layer m3. In this case, the shape of the photomask M4 (i.e., a part covering the resist layer m3) corresponds to a part on which the conducting paste is print-coated.

Figure 5C:
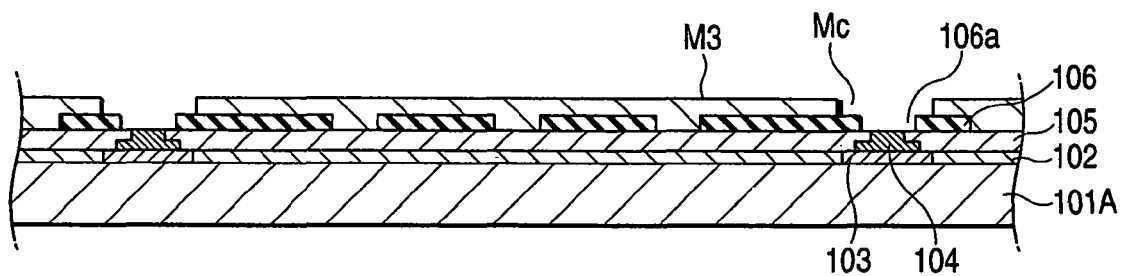
FIG. 5C is a view (#3) illustrating the modification of the method of manufacturing the semiconductor device shown in FIG. 1.

Next, in a step illustrated in FIG. 5C, the development of the resist layer m3 is performed to thereby form a mask pattern M3 having an opening portion Mc. That is, the patterning of the mask pattern M3 is performed according to the photolithography method.

Figure 5D:
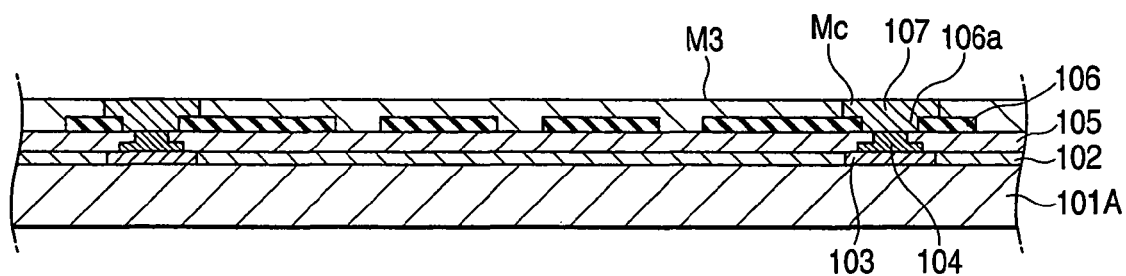
FIG. 5D is a view (#4) illustrating the modification of the method of manufacturing the semiconductor device shown in FIG. 1.
Figure 5E:
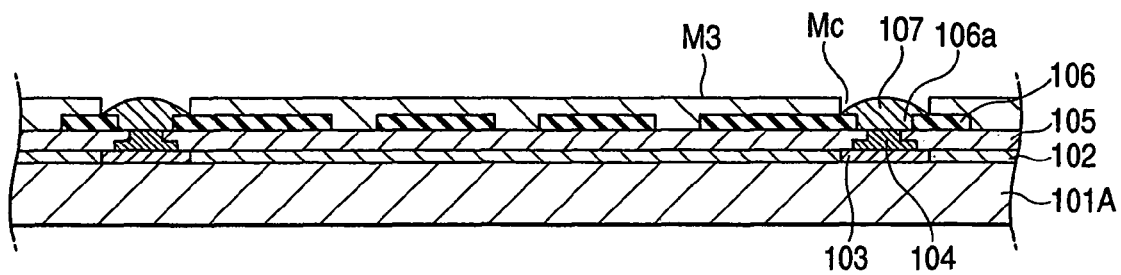
FIG. 5E is a view (#5) illustrating the modification of the method of manufacturing the semiconductor device shown in FIG. 1.

Next, in a step illustrated in FIG. 5D, an ordinary nonphotosensitive conducting paste is print-coated onto a part corresponding to the opening-portion Mc. Then, in a step illustrated in FIG. 5E, the applied conducting paste is hardened by being heated. Thus, the conducting paste 107 is formed.

Figure 5F:
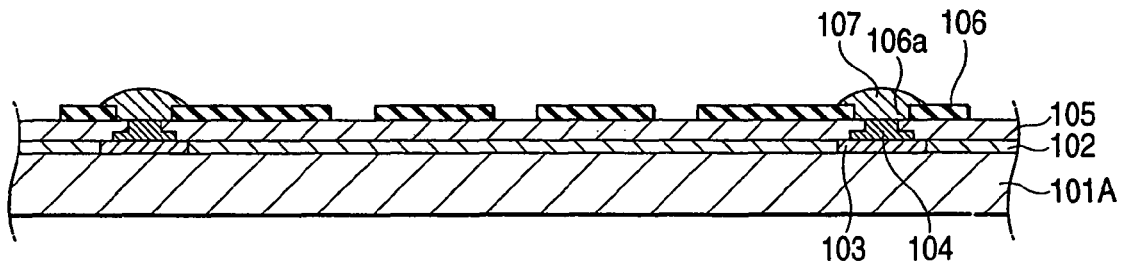
FIG. 5F is a view (#6) illustrating the modification of the method of manufacturing the semiconductor device shown in FIG. 1.

Further, in a step illustrated in FIG. 5F, the mask pattern M3 is exfoliated. Subsequently, steps according to Embodiment 4, which are illustrated in FIGS. 4K to 4M, are performed. Consequently, the semiconductor device 100 illustrated in FIG. 1 can be manufactured.

According to Embodiment 5, the patterning of a low-cost ordinary nonphotosensitive conducting paste can be achieved with good accuracy. Thus, an electrically conducting paste 107 connecting the conductive pattern 106 to the electric connection portion 104 are formed.

Embodiment 6

Next, a method of manufacturing the semiconductor device shown in FIG. 2 is described, in the order of steps to be sequentially performed, with reference to FIGS. 6A to 6D. Incidentally, processes, which are not specifically described in the following description of the present embodiment, are similar to the associated ones of Embodiment 4. In the case of the manufacturing method according to Embodiment 6, first, steps according to Embodiment 4, which are illustrated in FIGS. 4A to 4F, are performed.

Figure 6A:
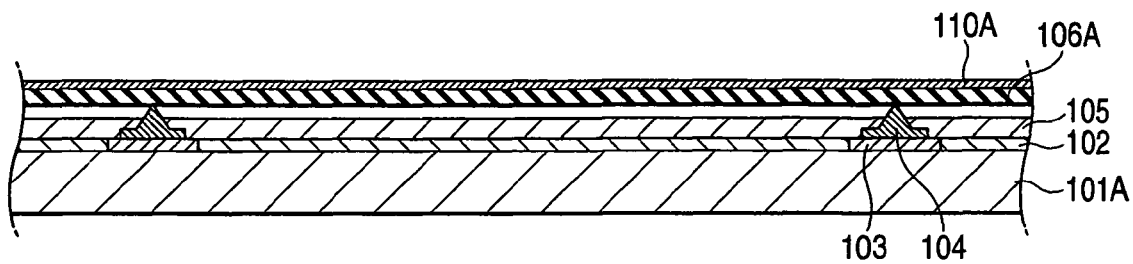
FIG. 6A is a view (#1) illustrating a method of manufacturing a semiconductor device shown in FIG. 2.

Next, in a step illustrated in FIG. 6A, the insulating layer 105 and the conductive layer 106A are formed, similarly to the step illustrated in FIG. 4D in Embodiment 4. Subsequently, a conductive layer (corresponding to a second conductive layer) 110A is formed on the conductive layer 106A. Alternatively, a laminate structure, in which the conductive layer 106A and the conductive layer 110A are preliminarily stacked, can be attached on to the semiconductor chip. The conductive layer 110A can be made of, for example, Sn, Ni, or Ti. The material of the conductive layer 110A is not limited thereto. The thickness of the conductive layer 110A can be set at, for example, 2 μm.

Figure 6B:
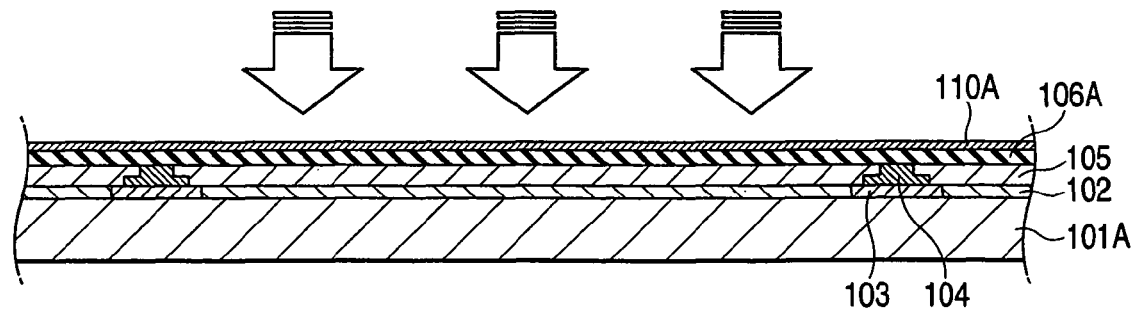
FIG. 6B is a view (#2) illustrating the method of manufacturing the semiconductor device shown in FIG. 2.

Subsequently, in a step illustrated in FIG. 6B, the conductive layer 110A is pressed from the top surface of the conductive layer 110A in a state in which a structure including the insulating layer 105 illustrated in FIG. 6B is heated, similarly to the step illustrated in FIG. 4E according to Embodiment 4. Thus, the thermosetting insulating layer 105 is cured. Consequently, the bottom surface of the conductive layer 106A is favorably closely attached to the insulating layer 105. Accordingly, the adhesiveness between the insulating layer 105 and the conductive layer 106A is made to be favorable.

Figure 6C:
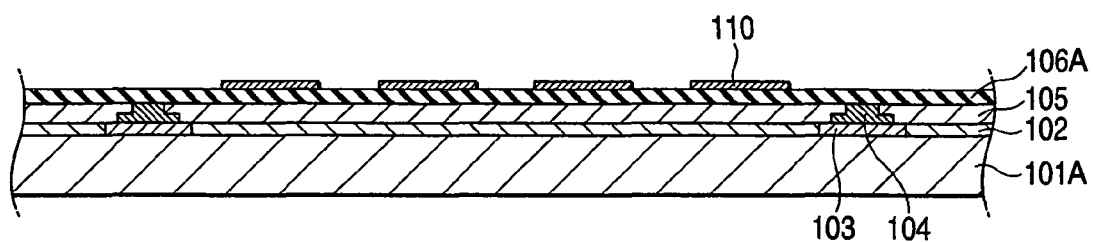
FIG. 6C is a view (#3) illustrating the method of manufacturing the semiconductor device shown in FIG. 2.

Next, in a step illustrated in FIG. 6C, an electrode pad 110 is formed by performing the pattern etching of the conductive layer 110A. The pattern etching is performed by etching using a predetermined mask pattern (not shown) as a mask. The mask pattern can be formed by performing the patterning of a resist layer, which is formed by applying liquid resist or by pasting film-like resist, according to a known photolithography method. In this step, the conductive layer 106A functions as an etching stopper layer. Additionally, upon completion of performing the pattern etching, the mask pattern is exfoliated.

Figure 6D:
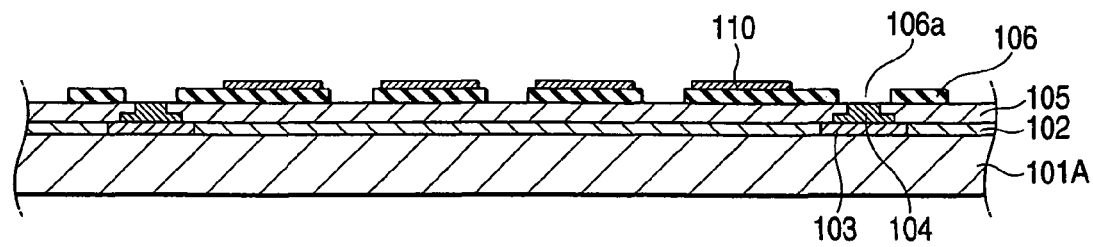
FIG. 6D is a view (#4) illustrating the method of manufacturing the semiconductor device shown in FIG. 2.

Next, in a step illustrated in FIG. 6D, an electrically conductive pattern (i.e., a pattern wiring) 106 is formed by performing the pattern etching of the conductive layer 106A, similarly to the step illustrated in FIG. 4F. Also, an opening portion 106a, from which the electric connection member is exposed, is formed in the conductive pattern 106.

Subsequently, steps similar to the steps illustrated in FIGS. 4G to 4M according to Embodiment 4 are performed. Consequently, the semiconductor device 100A illustrated in FIG. 2 can be manufactured.

The manufacturing method according to Embodiment 6 further forms the electrode pad 110 on the conductive pattern 106 so that the electrode pad 110 is patterned into a shape differing from the shape of the conductive pattern 106. Thus, electrically conductive patterns having various shapes can be formed on the conductive pattern 106.

Embodiment 7

Next, a method of manufacturing the semiconductor device 100B shown in FIG. 3 is described, in the order of steps to be sequentially performed, with reference to FIGS. 7A to 7E. Incidentally, processes, which are not specifically described in the following description of Embodiment 7, are similar to the associated ones of Embodiment 4 or 5. In the case of the manufacturing method according to Embodiment 7, first, steps according to Embodiment 4, which are illustrated in FIGS. 4A to 4C, are performed.

Figure 7A:
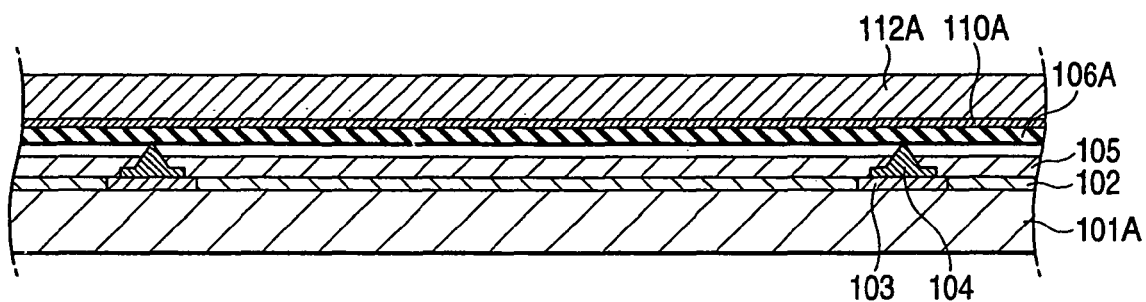
FIG. 7A is a view (#1) illustrating a method of manufacturing a semiconductor device shown in FIG. 3.

Next, in a step illustrated in FIG. 7A, the insulating layer 105 and the conductive layers 106A and 110A are formed, similarly to the step illustrated in FIG. 6A in Embodiment 6. Subsequently, a conductive layer (corresponding to a third conductive layer) 112A is formed on the conductive layer 110A. Alternatively, a laminate structure, in which the conductive layer 106A, 110A, and 112A are preliminarily stacked, can be attached onto the insulating layer 105. The conductive layer 112A can be made of, for example, Cu. The material of the conductive layer 112A is not limited thereto. The thickness of the conductive layer 112A can be set to be, for example, within a range from 50 μm to 100 μm.

Figure 7B:
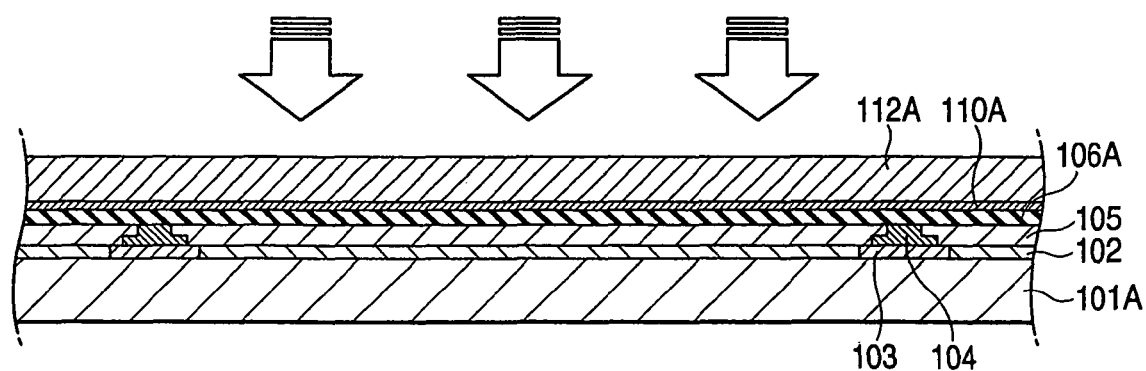
FIG. 7B is a view (#2) illustrating the method of manufacturing the semiconductor device shown in FIG. 3.

Subsequently, in a step illustrated in FIG. 7B, the conductive layer 112A is pressed from the top surface of the conductive layer 112A in a state in which a structure including the insulating layer 105 illustrated in FIG. 7B is heated, similarly to the step illustrated in FIG. 4E according to Embodiment 4. Thus, the thermosetting insulating layer 105 is hardened. Consequently, the bottom surface of the conductive layer 106A is favorably closely attached to the insulating layer 105. Accordingly, the adhesiveness between the insulating layer 105 and the conductive layer 106A is made to be favorable.

Figure 7C:
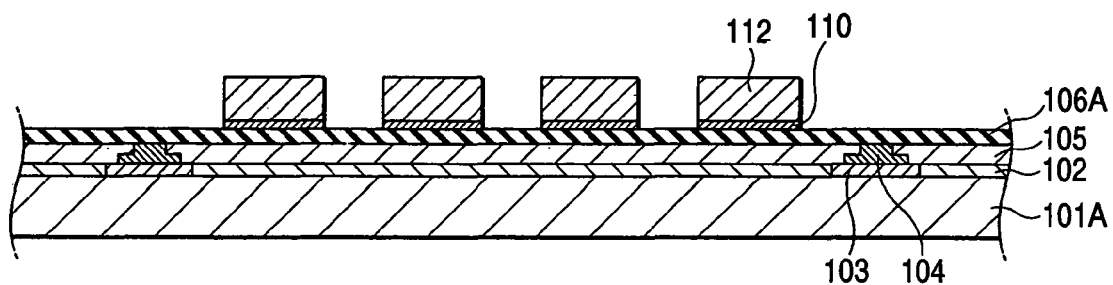
FIG. 7C is a view (#3) illustrating the method of manufacturing the semiconductor device shown in FIG. 3.

Next, in a step illustrated in FIG. 7C, a conductive post 112 is formed by performing the pattern etching of the conductive layer 112A. The pattern etching is performed by etching using a predetermined mask pattern (not shown) as a mask. The mask pattern can be formed by performing the patterning of a resist layer, which is formed by applying liquid resist or by pasting film-like resist, according to a known photolithography method.

Additionally, the electrode pad 110 is formed by performing the pattern etching of the conductive layer 110A using the mask pattern as a mask. Upon completion of performing the pattern etching, the mask pattern is exfoliated.

Figure 7D:
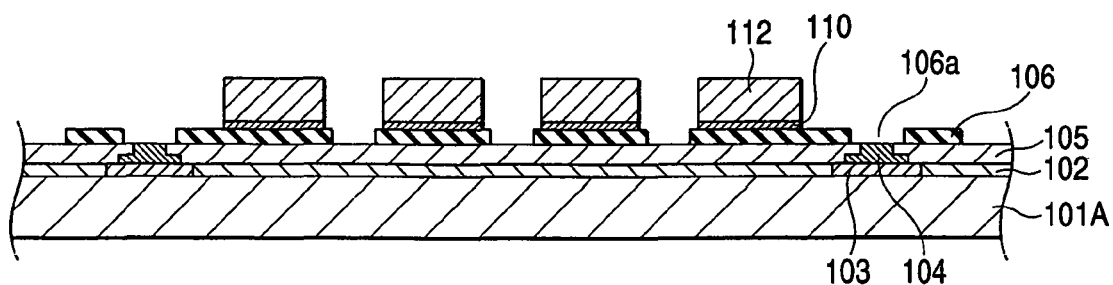
FIG. 7D is a view (#4) illustrating the method of manufacturing the semiconductor device shown in FIG. 3.

Next, in a step illustrated in FIG. 7D, an electrically conductive pattern (i.e., a pattern wiring) 106 is formed by performing the pattern etching of the conductive layer 106A, similarly to the step illustrated in FIG. 4F. Additionally, an opening portion 106a, from which the electric connection member is exposed, is formed in the conductive pattern 106.

Subsequently, steps similar to the steps illustrated in FIGS. 4G to 4M according to Embodiment 4 are performed. Consequently, the semiconductor device 100B illustrated in FIG. 3 can be manufactured. However, in the case of Embodiment 7, an insulating layer 111 made of a mold resin is formed, instead of the insulating layer 108 made of a solder-resist layer.

The manufacturing method according to Embodiment 7 features that the conductive post 112 is further formed on the electrode pad 110. Thus, Embodiment 7 has an advantage that in a case where the semiconductor device is connected to a substrate, such as a motherboard, which is a connection target, stress applied to the conductive pattern 106 (i.e., the semiconductor chip 101) and to the external connection terminal 109 is released.

Embodiment 8

The method of manufacturing a semiconductor device according to Embodiment 4 can be modified, for example, in the following manner. Incidentally, processes, which are not specifically described in the following description of Embodiment 8, are similar to the associated ones of Embodiment 4. In the case of the manufacturing method according to Embodiment 8, first, steps according to Embodiment 4, which are illustrated in FIGS. 4A to 4C, are performed.

Figure 8A:
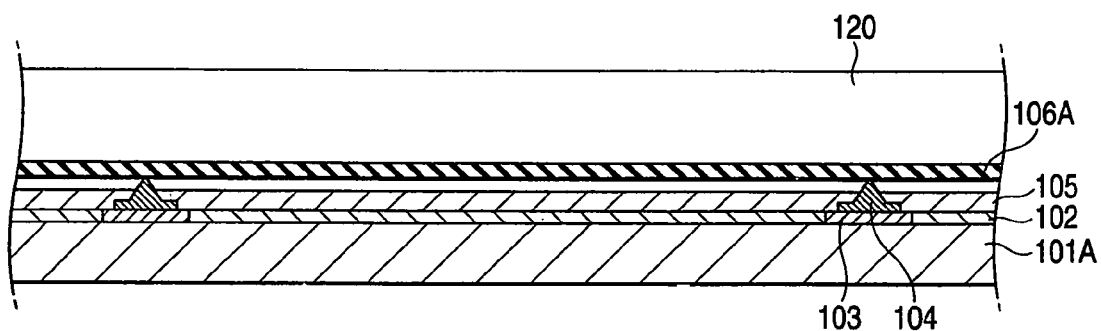
FIG. 8A is a view (#1) illustrating an additional modification of the method of manufacturing the semiconductor device shown in FIG. 1.

Next, in a step illustrated in FIG. 8A, an electrically conductive layer 106A supported by a support layer 120 (i.e., the support layer 120 is stacked on the conductive layer 106A) is attached to an insulating layer 105.

Figure 8B:
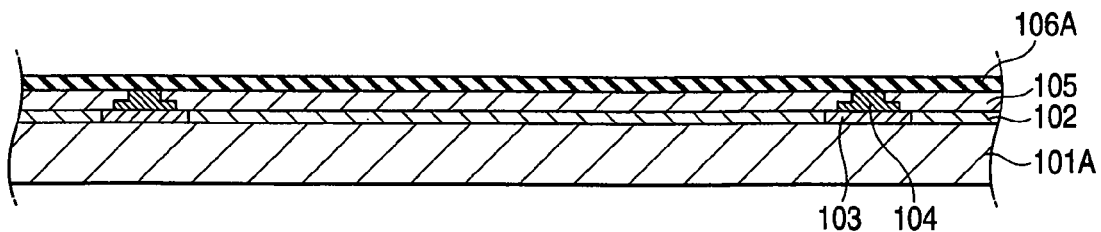
FIG. 8B is a view (#2) illustrating the additional modification of the method of manufacturing the semiconductor device shown in FIG. 1.

Next, in a step illustrated in FIG. 8B, the support layer 120 is pressed from the top surface of the support layer 120 in a state in which an insulating layer 105 is heated, similarly to the step illustrated in FIG. 4E. Thus, the thermosetting insulating layer 105 is hardened. Thus, the bottom surface of the conductive layer 106A is favorably closely attached to the insulating layer 105. Consequently, the adhesiveness between the insulating layer 105 and the conductive layer 106A is made to be favorable. Subsequently, the support layer 120 is removed. Consequently, the semiconductor device is put into a state illustrated in FIG. 8B.

Subsequently, steps similar to the steps illustrated in FIGS. 4G to 4M according to Embodiment 4 are performed. Consequently, the semiconductor device 100 illustrated in FIG. 1 can be manufactured.

According to Embodiment 8, the conductive layer 106A is attached to the insulating layer 105 in a state in which the conductive layer 106 A is supported by the support layer 120 (i.e., the support layer 120 is stacked on the conductive layer 106A). Consequently, even in a case where the conductive layer 106A is thin, the conductive layer 106 can be prevented from being damaged. Accordingly, the conductive layer 106A can stably be attached to the insulating layer 105.

Although preferred embodiments of the invention are described in the foregoing description, the invention is not limited to such specific embodiments. Various modifications and alterations may be made within a scope of the gist of the invention set forth in claims.

According to the invention, a highly reliable semiconductor device, which can be manufactured at low cost, and a manufacturing method therefor can be provided.

What is claimed is:
1. A semiconductor device comprising:
    a semiconductor chip on which an electrode pad is formed;
    an electric connection member formed on the electrode pad;
    an insulating layer formed on the semiconductor chip; and
    an electrically conductive pattern formed on the insulating layer, wherein
    an opening portion corresponding to the electric connection member is formed in the conductive pattern, and the electric connection member is exposed from the opening portion formed in the conductive pattern;
    the conductive pattern is electrically connected to the electric connection member by an electrically conducting paste embedded in the opening portion, and
    wherein the semiconductor device further comprises a second insulating layer formed over a top of the electrically conducting paste, and an opening portion is formed in the second insulating layer and an external connection terminal is provided therein.
2. The semiconductor device according to claim 1, wherein the electric connection member is formed by a bonding wire.
3. The semiconductor device according to claim 1, wherein an electrode pad or an electrically conductive post is formed on the conductive pattern so as to form the external connection terminal thereon.

\* \* \* \* \*